(12) United States Patent
Wallace

(10) Patent No.: US 6,597,061 B1
(45) Date of Patent: Jul. 22, 2003

(54) CARD MANUFACTURING TECHNIQUE AND RESULTING CARD

(75) Inventor: Robert F. Wallace, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 69 days.

(21) Appl. No.: 09/921,664

(22) Filed: Aug. 3, 2001

(51) Int. Cl.⁷ .............................. H01L 23/48
(52) U.S. Cl. .................. 257/679; 257/685; 257/787
(58) Field of Search .................. 257/679, 787, 257/685, 687

(56) References Cited

U.S. PATENT DOCUMENTS

| | | | |
|---|---|---|---|
| 5,942,794 A | * | 8/1999 | Okumura et al. |
| 5,969,416 A | * | 10/1999 | Kim |
| 6,040,622 A | | 3/2000 | Wallace |
| 6,507,117 B1 | * | 1/2003 | Hikita et al. |

FOREIGN PATENT DOCUMENTS

| EP | 0340492 A2 | * | 11/1989 |
|---|---|---|---|
| GB | 1290800 A | | 9/1972 |

OTHER PUBLICATIONS

Patent Abstracts of Japan, vol. 1998, No. 14, Dec. 31, 1998 & JP 10 242608 A, Sep. 11, 1998, abstract.
Hosseini, S.: "The Electrical Insulation of Electroplating Bus Bars in Flexes," Motorola Inc., Schaumburg, Illiniois, vol. 15, May 1, 1992, p. 39.
Patent Abstracts of Japan, vol. 016, No. 364, Aug. 6, 1992 & JP 04 114490 A, Apr. 15, 1992, abstract.
Patent Abstracts of Japan, vol. 014, No. 082, Feb. 15, 1990 & JP 01 295476 A, Nov. 29, 1989, abstract.

\* cited by examiner

*Primary Examiner*—Stephen D. Meier
(74) *Attorney, Agent, or Firm*—Parsons Hsue & de Runtz LLP

(57) ABSTRACT

A card manufacturing technique and the resulting card are provided. The card has a ground and/or power layer extending to the edges of a circuit board for electrostatic discharge protection but also has gaps at the edge of the ground and/or power layer to avoid short circuiting with conductive segments of another layer deformed when the card is trimmed during manufacture.

15 Claims, 5 Drawing Sheets

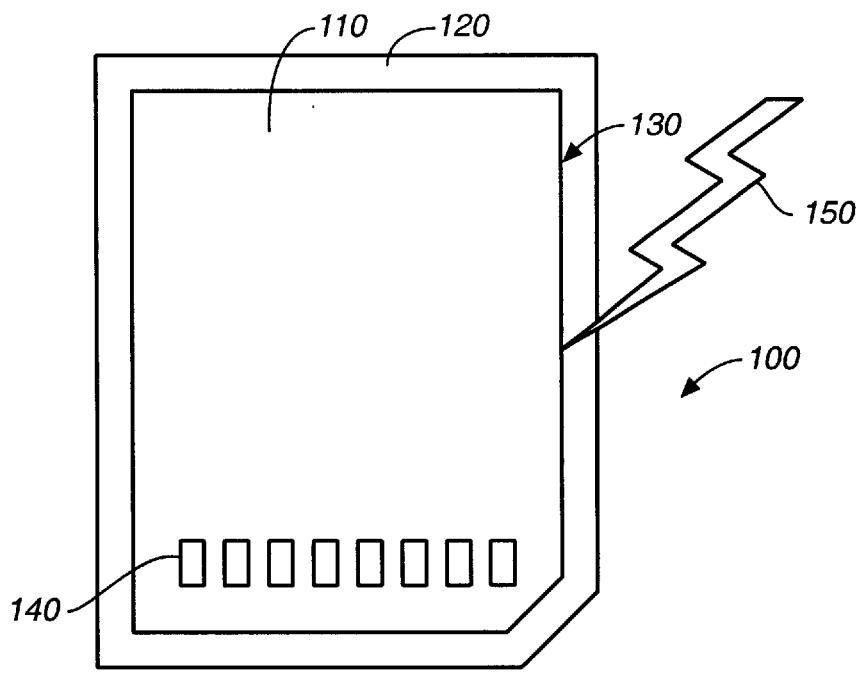
FIG._1
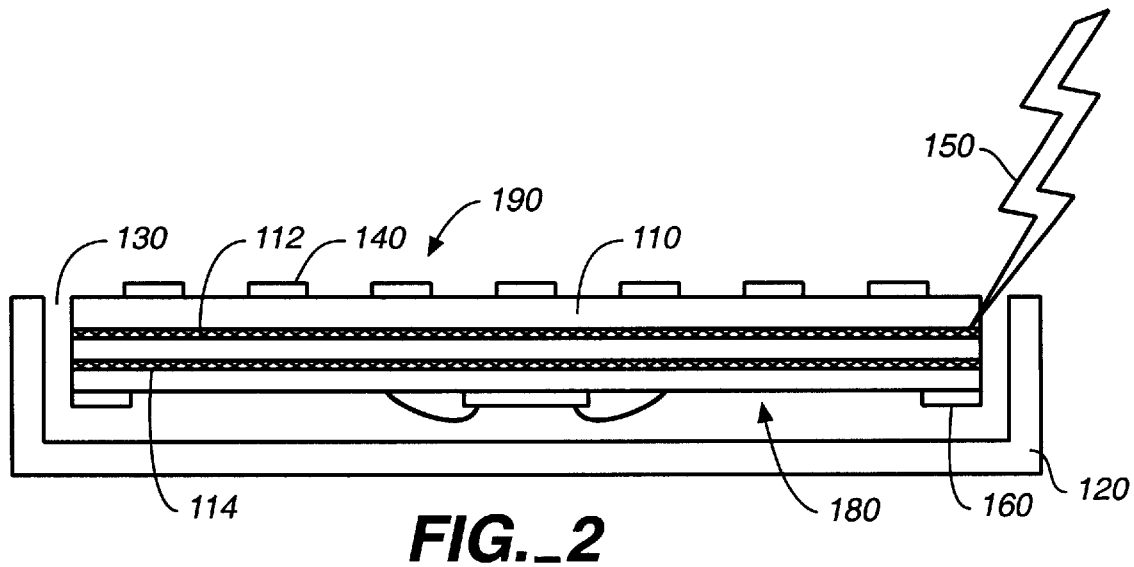
FIG._2

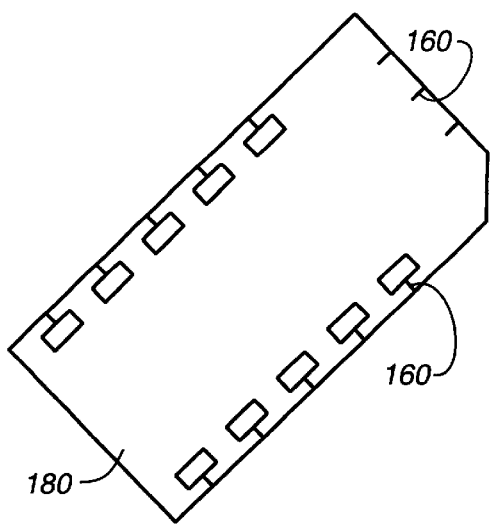
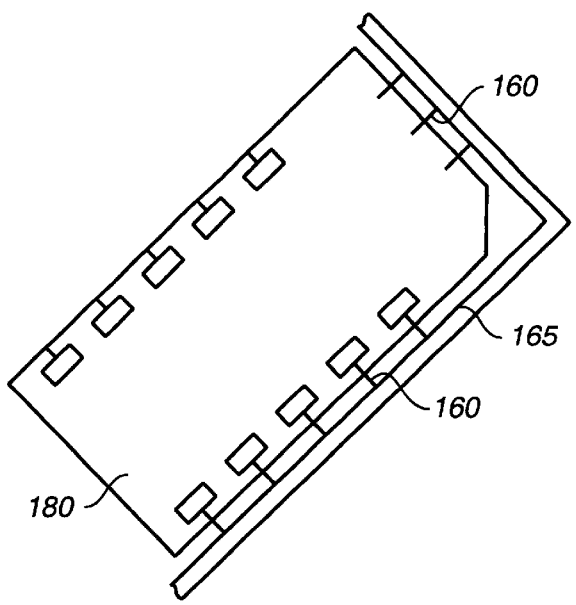
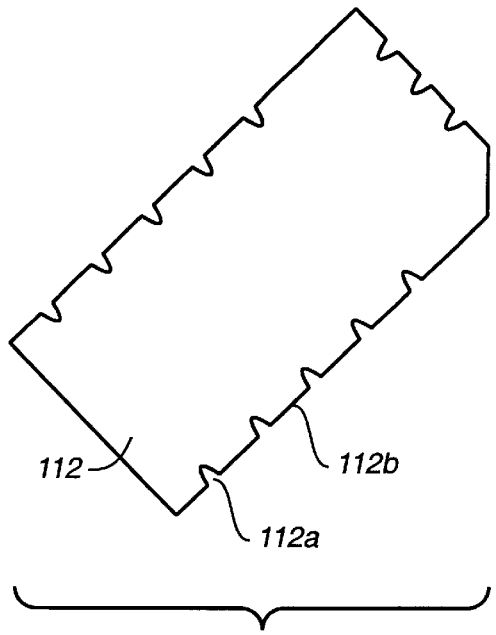
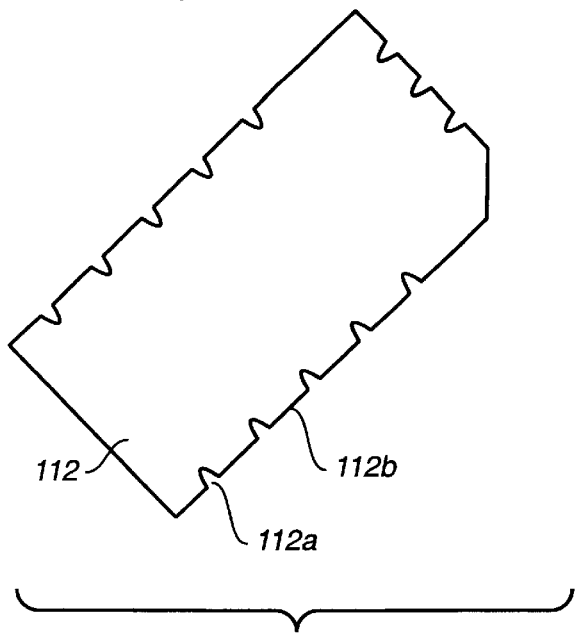
FIG._3  FIG._4

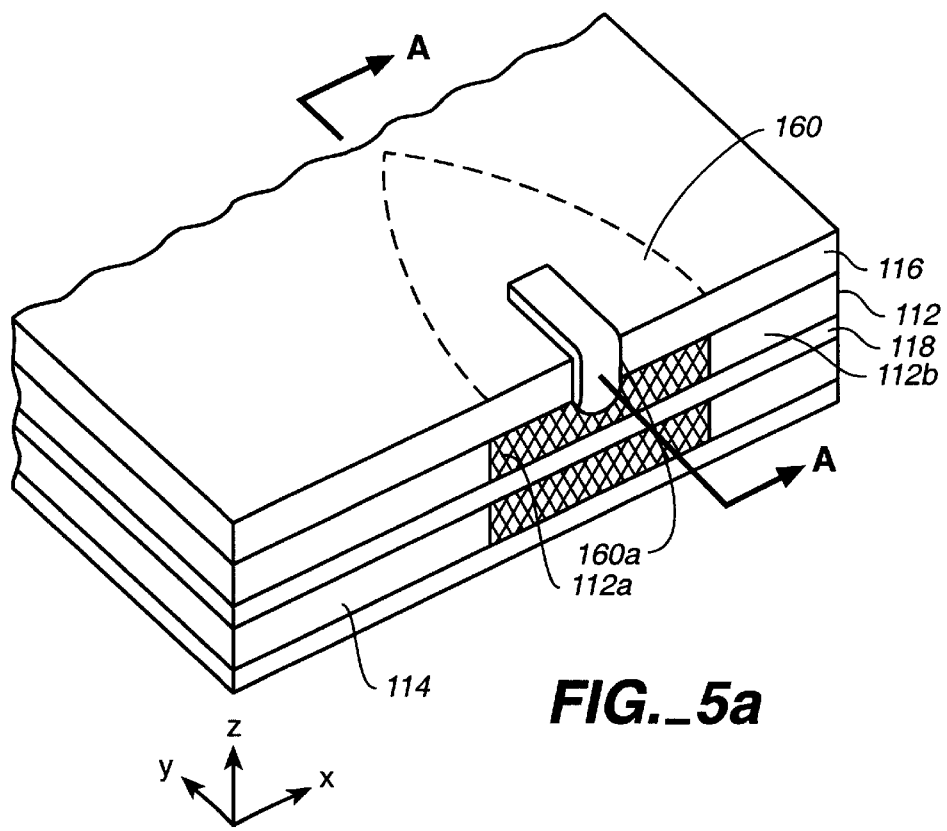
FIG._5a
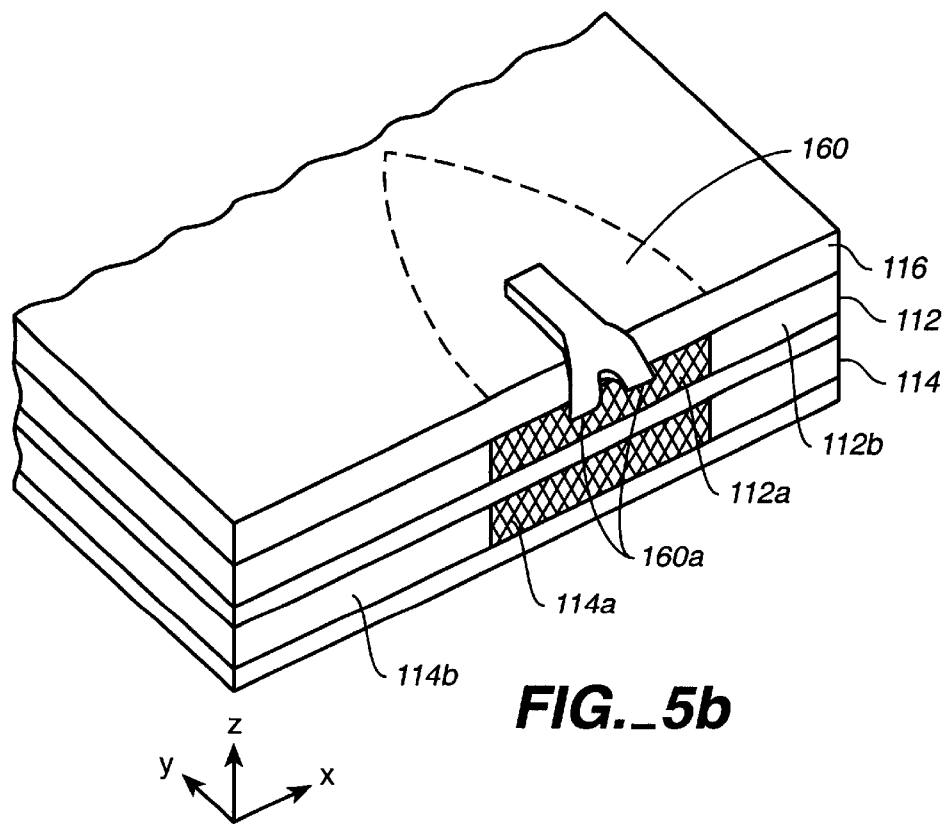
FIG._5b

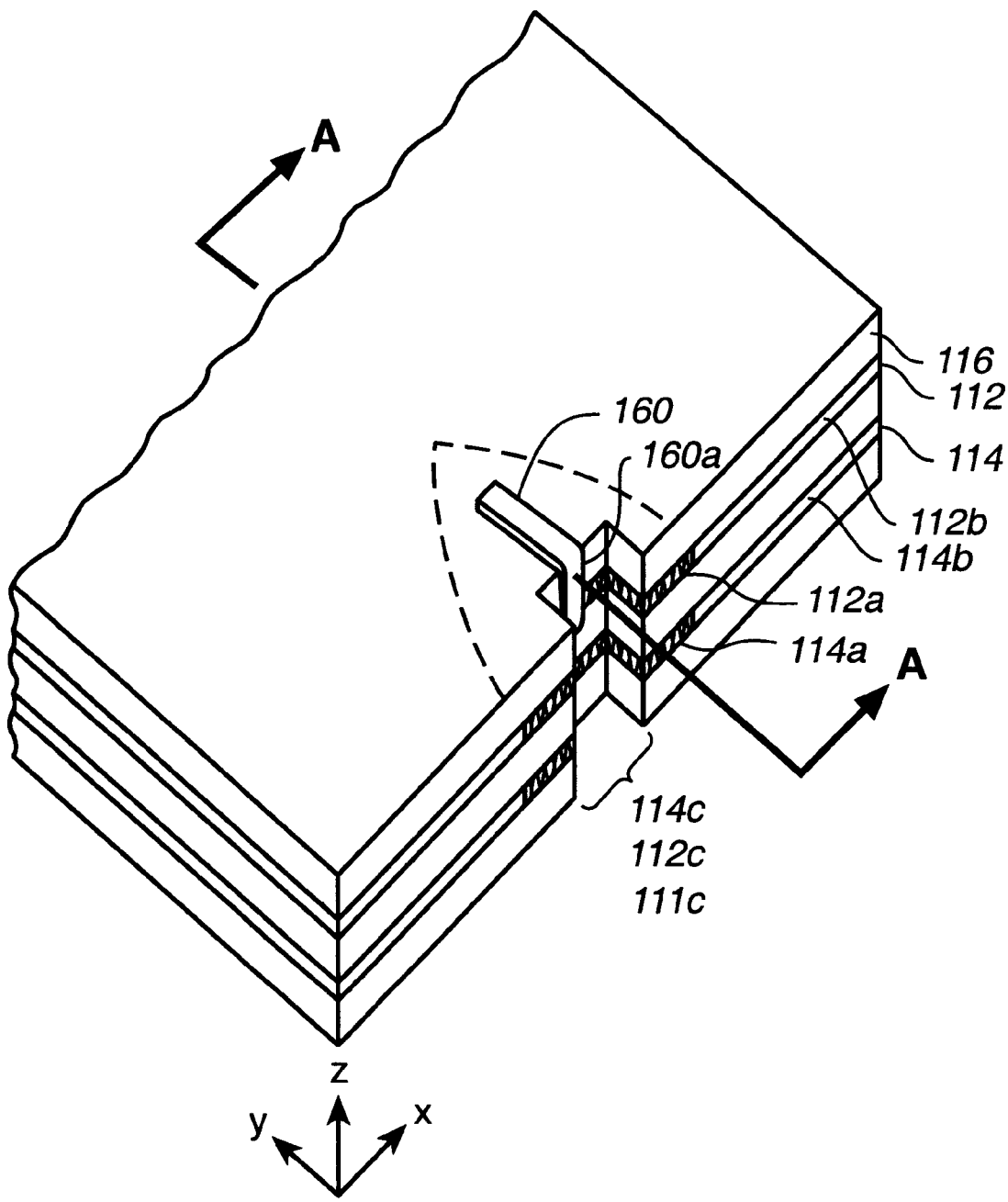
FIG._5c

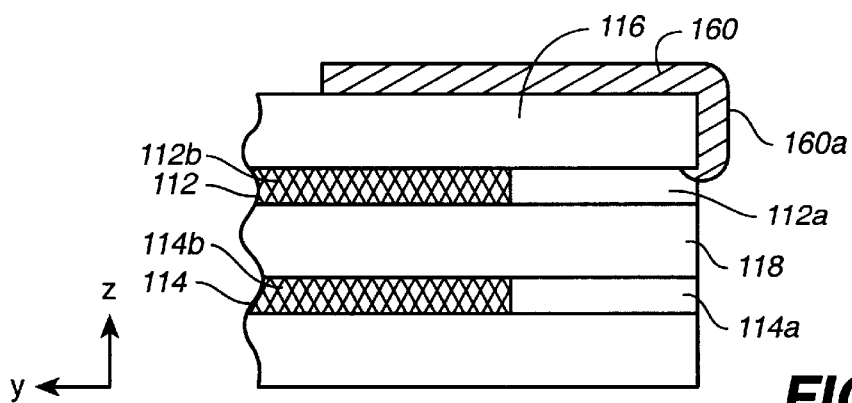
FIG._6a
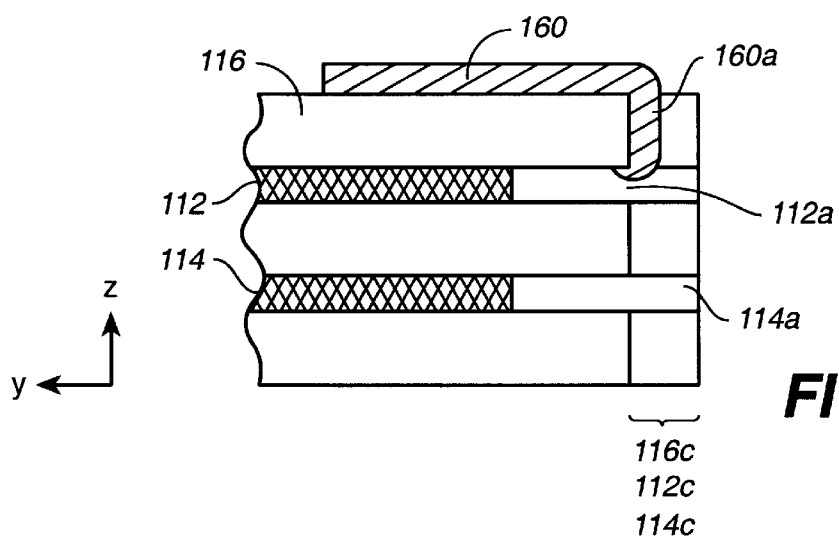
FIG._6c
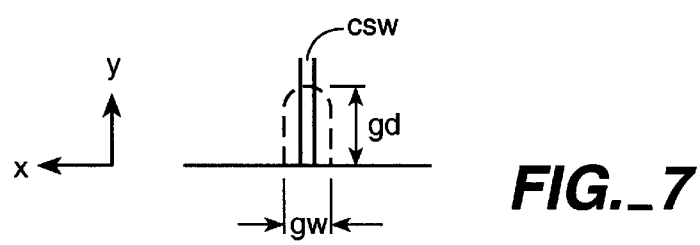
FIG._7
FIG._8

CARD MANUFACTURING TECHNIQUE AND RESULTING CARD

CROSS REFERENCE TO RELATED APPLICATIONS

The present application is related to U.S. Application No. 09/096,140 issued as U.S. Pat. No. 6,040,622 which is hereby incorporated by reference in its entirety.

FIELD OF THE INVENTION

The invention relates generally to circuit boards, a method of making a memory card integrating a circuit board, and the resulting memory card.

BACKGROUND OF THE INVENTION

This invention relates generally to circuit boards, and more specifically to circuit boards of memory cards utilized in portable devices to store data. Although the invention has application to a wide variety of circuit boards, it is described herein to be implemented in a memory card, specifically a portable memory card having flash electrically-erasable and programmable read-only memory (flash EEPROM).

In recent years, devices such as digital cameras, digital audio players, and personal digital assistants have become popular. These devices require a large amount of storage capacity in a small and rugged package. Memory cards utilizing high density non-volatile memory are frequently inserted and removed from these devices and printers or external readers attached to personal computers. The frequent handling of these cards results in a high risk of electrostatic discharge.

Thus, it is desired to have a small thin memory card that is immune from electrostatic discharge yet simple to manufacture and assemble.

SUMMARY OF THE INVENTION

Memory cards are getting smaller and thinner, yet the capacity is increasing and they are also becoming more densely packaged. Frequent handling of these cards results in a high risk of electrostatic discharge (ESD).

A memory card and a method of making a memory card resistant to damage from electrostatic discharge and less prone to short circuiting of the multiple conductive layers of the card is described. The memory card is formed by encapsulating or placing a circuit board into a plastic cover. At a junction between the plastic cover and an edge of the circuit board there is a gap where an electrostatic discharge is prone to enter and damage the circuit components of the memory card. The ground and power layer extend to the edge of the circuit board and along the junction between the circuit board and the memory card. Thus any electrostatic discharge is absorbed by either of these layers and damage to the other circuit components from the high voltage discharge is avoided. A prior method of avoiding short circuits due to the trimming process involved pulling back the entire edge of the conductive layer away from the edge of the circuit board, however this method affords little if any ESD protection to the susceptible components of the memory card.

During the manufacturing of the memory card, the circuit board is trimmed to its final dimensions. Conductive segments of a metallic layer that are located at the edge of the circuit board are deformed during the trimming process and can extend over an insulating layer and contact a second metallic layer, in this case either the ground or power layer, thus resulting a short circuit. As previously mentioned, it is desirous to extend the ground and/or power layer to the junction of the card for electrostatic discharge purposes. Therefore, in order to avoid short circuiting yet preserve maximum ESD protection, small gaps are formed at the edge of the second conductive layer that are vertically aligned with the conductive segments such that any deformation that may occur during the trimming process will not result in a short circuit. The deformation of the conductive segments will fall into the gap at the edge of the second conductive layer rather than making contact with the layer. The size of the gaps is small in relation to the remaining edge of the ground and/or power layer at the junction of the circuit board and the cover, thus ensuring a high level of ESD protection while avoiding short circuits from the trimming of the board.

BRIEF DESCRIPTION OF THE DRAWINGS

FIG. 1 is a top view of the memory card exemplifying the present invention.

FIG. 2 is a cross-sectional view of the memory card exemplifying the present invention.

FIG. 3 is a perspective exploded view showing the conductive layers of the card.

FIG. 4 is a perspective exploded view showing the conductive layers of the card during manufacturing.

FIG. 5a is an enlarged perspective view of an edge of the memory card.

FIG. 5b is an enlarged perspective view of another example of an edge of the memory card.

FIG. 5c is an enlarged perspective view of another example of an edge of the memory card.

FIG. 6a is a cross-sectional view along section A—A of the card shown in FIGS. 4 and 5a.

FIG. 6c is a cross-sectional view along section A—A of the card shown in FIGS. 4 and 5c.

FIG. 7 is a top view of a gap of FIGS. 3–5.

FIG. 8 is a top view of examples of gaps in the conductive layer of the card.

DESCRIPTION OF EXEMPLARY EMBODIMENTS

FIG. 1 shows the rear side of a memory card exemplifying the present invention. The memory card 100 comprises a circuit board 110 having an exposed rear side with terminals 140 and a covered front side (not shown). The covered side comprises at least one integrated circuit including flash memory, circuit traces, and passive components, which are not shown. Cover 120 covers over the front side and edges of the circuit board, such that the rear side of the circuit board is exposed to form substantially all of the rear side of the memory card. A narrow gap 130 at the junction between the edges of circuit board 110 and cover 120 exists. An electrostatic discharge 150 is shown entering the narrow gap 130 at the junction between the edges of circuit board 110 and cover 120. U.S. Pat. No. 6,040,622 to Wallace, entitled "Semiconductor Package Using Terminals Formed on a Conductive Layer of a Circuit Board" describes in detail the construction of a memory package in detail and is hereby incorporated by reference in its entirety.

FIG. 2 shows the gap 130 between circuit board 110 and cover 120 highly exaggerated for illustrative purposes. Conductive layers 112 and 114 extend to the edge of circuit board 110. The gap is quite small, but large enough that an electrostatic discharge (ESD) 150 can reach conductive layer 112 or 114. The conductive layers can be either the ground layer or power layer. In the case of an ESD, the ESD will be absorbed by the conductive layers 112 and 114, rather than by any of the circuit components on the front side 180 of circuit board 110. The front side 180 has at least one integrated circuit including flash memory, circuit traces, and passive components.

FIG. 3 shows the bottom of the circuit board 110 with segments 160 of a conductive layer. These segments may be part of circuit traces on the front side of the circuit board, may be segments that were used for electroplating purposes on either the front or the back of the circuit board, or may be test leads that are not needed after a testing or burn in period of the board. During the production of the circuit board, it is cut or sheared to its final dimensions and placed into a plastic cover or encapsulated as seen in FIG. 1. The final shearing or cutting is performed in a direction from the front side 180 to the rear side 190 such that any deformation from the process would extend along edges of circuit board 110 from the covered front side 180 down to the exposed rear side 190. Thus for the purposes of describing the relation of the component parts during the shearing or cutting process, the conductive layers 112 or 114 are described as below the conductive segments 160 seen on the covered front side 180 of the circuit board.

FIG. 4 illustrates an intermediate stage in the production of the circuit board. At this stage, segments 160 are connected to bus 165. Segments 160 and bus 165 are part of the same conductive layer before circuit board 180 is trimmed to its final dimensions. The segments in this intermediate example may be circuit traces used in electroplating on either the front or back of the circuit board, or as in FIG. 3 may be functional circuit elements or test leads. The present invention protects against short circuiting of any conductive segments of a conductive layer positioned above another conductive layer during a cutting or shearing operation.

FIG. 5a is an enlarged view of an edge of some of the layers of the circuit board after shearing showing only one gap or slot for illustrative purposes. FIG. 5a shows conductive layer 112 positioned below the conductive segments 160. An insulating layer 116 is positioned between the conductive segments 160 and the conductive layer 112. Conductive layer 112 has gaps 112a and edge portions 112b. Gaps 112a are wider (i.e. larger in the X direction) than segments 160 and any deformation of segments 160 that may reach the plane of conductive layer 112 during the shearing or cutting process will arrive at gap 112a rather than contact any portion of the conductive layer 112, thus avoiding a short circuit. Note that edge portions 112b of circuit board 110 are located at the junction 130 between circuit board 110 and cover 120 as seen in FIG. 1. Thus a rather large part of the conductive layer is positioned at the edge of the circuit board to attract any ESD which may occur, while at the same time any potential short circuit resulting from contact of segments 160 with layer 112 or 114 is avoided.

FIG. 6a is a cross sectional view taken along section A—A of the circuit board shown in FIG. 5a. Conductive segment 160 on insulating layer 116 has been deformed during the shearing or cutting operation such that deformation 160a of segment 160 extends down the edge of the circuit board. The amount of deformation and thus size of deformation 160a depend on the shearing force, the geometry of the shearing instrument, and the elasticity of the metal of the conductive segment. It is foreseen that the deformation may extend down the edge of the circuit board, i.e. in the Z direction, into or away from the edge of the board, i.e. in the Y direction, and across the edge of the board, i.e. in the X direction. Thus the gap 112a is made sufficiently wide enough that any amount of deformation in the X direction will fall into the gap and not contact edge portions 112b. Gap 112a is also sufficiently deep enough that any deformation that extends into the gap, or in the Y direction, will likewise not contact conductive layer 112. Conductive layer 114 is fashioned in the same method and has the same structure as layer 112. Layer 112 or 114 may respectively be either the ground or power layer. FIG. 7 shows the relative width, or size of the gap and the segment in the X and Y directions. The size of the conductive segments can vary widely depending on the function of the segment, but generally range from about one mil (0.001") up to about 50 mils (0.05"), and the width and depth of the gap are sized proportionally to the segment with sufficient tolerance such that any deformation will enter the gap and not make contact with the conductive layer. In one example, the width csw of conductive segment 160a of FIG. 7 is 4 mils wide (i.e. in the X direction), and the width gw of gap 112a is 40 mills from edge to edge (i.e. in the X direction) while the depth gd is 60 mills (i.e, in the Y direction).

FIG. 5b is an enlarged view of another example of an edge of the circuit board. This figure illustrates possible deformation patterns of segment 160. Deformation 160a may extend not only in the Z direction as illustrated by FIG. 5a, but also laterally along the X axis and into the gaps 112a along the Y axis as a result of the trimming of the circuit board. Gap 112a is made wide enough (i.e. along the X axis) such that any deformation 160a will fall into gap 112a or 114a and not make contact with edge portions 112b of conductive layer 112 or 114. Likewise, it is deep enough (i.e. along the Y axis) such that any deformation into memory card 100 will fall into gap 112a or 114a and not make contact with layer 112 or layer 114. In FIG. 5b deformations 160a are only shown extending to layer 112. However deformation 160a may extend to layer 114 and would thus fall into gap 114a rather than make contact with edge portions 114b.

FIG. 5c is an enlarged view of another example of an edge of the circuit board. In this example, all of the layers of the circuit board are slotted at the edge of the circuit board. A slot 116c, 112c, and 114c is formed in insulating layer 116, conductive layer 112, and conductive layer 114 respectively. The slot runs through all of the layers of the circuit board including the layers that are not shown and the layers that are not numbered. Slots 116c, 112c, and 114c are smaller in both the X and Y direction than the gaps 112a and 114a in conductive layers 112 and 114. Thus, the gaps 112a and 114a extend laterally (i.e. in the X direction) on either side of slots 112c and 114c. The gaps 112a and 114a also extend deeper (i.e. in the Y direction) than slots 112c and 11 4c. Thus the slots are formed within the gaps and are completely surrounded by the gaps. As with the previous examples of FIGS. 5a and 5b, any deformation 160a that may occur will fall into gaps 112a and 114a rather than make contact with edge portions 112b or 114b of conductive layers 112 and 114. Thus, short circuiting is avoided. There can be many different variations in the geometry of the edge, and in particular the slots 116, 112, and 114 so long the gaps in the conductive layers 112 and 114 are larger in the X and Y direction than the conductive segments 160 that they are aligned with.

FIG. 6c is a cross sectional view taken along section A—A of the circuit board shown in FIG. 5c. As described above regarding FIG. 6a, conductive segment 160 on insulating layer 116 has been deformed during the shearing or cutting operation such that deformation 160a of segment 160 extends down the edge of the circuit board. The amount of deformation and thus size of deformation 160a depend on the shearing force, the geometry of the shearing instrument, and the elasticity of the metal of the conductive segment. It is foreseen that the deformation may extend down the edge of the circuit board, i.e. in the Z direction, into or away from the edge of the board, i.e. in the Y direction, and across the edge of the board, i.e. in the X direction. Thus the gap 112a is made sufficiently wide enough that any amount of deformation in the X direction will fall into the gap and not contact edge portions 112b or 114b. Gap 112a is also sufficiently deep enough that any deformation that extends into the gap, or in the Y direction, will likewise not contact conductive layer 112 or conductive layer 114.

FIG. 8 shows some of the various shapes that gap 112a may have. Gap 112a may have many different sizes and shapes, all of which are proportionately large enough to avoid any short circuit between deformation 160a and conductive layer 112 or 114.

While an illustrative example of the invention has been shown and described, it will be apparent that other modifications, alterations and variations may be made by and will occur to those skilled in the art to which this invention pertains.

It is therefore contemplated that the present invention is not limited to the embodiments shown and described and that any such modifications and other embodiments as incorporate those features which constitute the essential features of the invention are considered equivalents and within the true spirit and scope of the present invention.

What is claimed is:

1. A circuit board having at least one peripheral edge comprising:
    a first conductive layer having conductive segments at the edge of the circuit board;
    a first insulative layer;
    a second conductive layer separated from the first conductive layer by the first insulative layer, positioned below the first conductive layer, and extending to the edge of the circuit board, the second conductive layer having gaps at the edge of the circuit board, one or more of the gaps aligned with the conductive segments whereby any deformation of the conductive segments that extends over the edge to the plane of the second layer extends within the gaps and does not contact the second conductive layer.

2. The circuit board of claim 1 wherein the gaps are slots.

3. The circuit board of claim 1 wherein the gaps are notches.

4. The circuit board of claim 1 wherein the width of the gap is smaller away from the edge than it is at the edge of the circuit board.

5. The circuit board of claim 1 wherein the second conductive layer is the ground or power layer.

6. The circuit board of claim 1 further comprising a third conductive layer, the third conductive layer having gaps at the edge of the circuit board, the gaps aligned with the conductive segments whereby any deformation of the conductive segments that extends to the plane of the third layer extends within the gaps and does not contact the third conductive layer.

7. The circuit board of claim 6 wherein the third conductive layer is the ground or power layer.

8. The circuit board of claim 1 further comprising at least one integrated circuit including flash memory, circuit traces, and passive components.

9. A circuit board having at least one edge comprising:
    a power layer extending to the at least one edge;
    a ground layer extending to the at least one edge; and
    at least one additional layer having metallic segments at the at least one edge of the circuit board, the at least one additional layer separated from the ground or power layer by an insulating layer;
    wherein portions of the ground or power layer positioned under the metallic segments at the at least one edge are slotted whereby any deformation of the metallic segments at said at least one edge does not contact the ground or power layer.

10. The circuit board of claim 9 wherein the metallic segments connect to a bus which is also trimmed from the circuit board.

11. The circuit board of claim 9 wherein the metallic segments are circuit traces.

12. The circuit board of claim 9 wherein the metallic segments are test leads.

13. The circuit board of 9 further comprising at least one integrated circuit including flash memory, circuit traces, and passive components.

14. A structure comprising:
    a metallic layer comprising at least one bus, a first area, and segments connecting the at least one bus to the first area; and
    a circuit board comprising:
        at least one edge, wherein the first area of the metallic layer forms a first layer of the circuit board and wherein the segments connecting the bus to the first area are positioned at the at least one edge of the circuit board and extend over the at least one edge of the circuit board to the at least one bus;
        an insulative layer below the metallic layer; and
        a second conductive layer positioned below the metallic layer and the insulative layer and extending to the at least one edge, the second conductive layer having gaps at the at least one edge of the circuit board, whereby at least one of the gaps is aligned with at least one of the segments.

15. The structure of claim 14 whereby any deformation of the conductive segments that extends over the at least one edge to the plane of the second conductive layer extends within the gaps and does not contact the second conductive layer.

* * * * *